US012269770B2

United States Patent
Xia et al.

(10) Patent No.: US 12,269,770 B2
(45) Date of Patent: Apr. 8, 2025

(54) RED LIGHT EMITTING GLASS CERAMIC AND PREPARATION METHOD THEREOF, AND LED/LD LIGHT EMITTING DEVICE

(71) Applicant: SOUTH CHINA UNIVERSITY OF TECHNOLOGY, Guangzhou (CN)

(72) Inventors: Zhiguo Xia, Guangzhou (CN); Tao Hu, Guangzhou (CN); Qinyuan Zhang, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 531 days.

(21) Appl. No.: 17/842,812

(22) Filed: Jun. 17, 2022

(65) Prior Publication Data

US 2022/0315477 A1 Oct. 6, 2022

Related U.S. Application Data

(63) Continuation of application No. PCT/CN2021/077874, filed on Feb. 25, 2021.

(30) Foreign Application Priority Data

Sep. 29, 2020 (CN) .......................... 202011046618.3

(51) Int. Cl.
*C03C 4/12* (2006.01)
*C03B 1/00* (2006.01)
(Continued)

(52) U.S. Cl.
CPC .................. *C03C 4/12* (2013.01); *C03B 1/00* (2013.01); *C03B 32/02* (2013.01);
(Continued)

(58) Field of Classification Search
CPC . C09K 11/77344; C03C 4/12; C03C 10/0045; H10H 20/8512; H10H 20/0361; C03B 1/00; C03B 32/02
See application file for complete search history.

(56) References Cited

U.S. PATENT DOCUMENTS 5,532,194 A * 7/1996 Kawashima ........ C03C 10/0045
501/69

FOREIGN PATENT DOCUMENTS

CN 106495474 3/2017
CN 107746709 3/2018
(Continued)

OTHER PUBLICATIONS

Stefanska et al , "High Efficiency Emission of Eu2+ Located in Channel and Mg-site of Mg2Al4Si5O18 Cordierite and Its Potential as a Bi-Functional Phosphor Toward Optical Thermometer and White LED Application", Advanced Optical Materials, vol. 8, Issue 22, Nov. 18, 2020, pp. 1-10.*
Kang, Xiaohong, "Preparation and Luminescent properties of tailings glass-ceramics", Thesis of Master Degree, Xi'an University of Architecture and Technology, Jun. 2017, pp. 1-88.
(Continued)

*Primary Examiner* — C Melissa Koslow
(74) *Attorney, Agent, or Firm* — JCIPRNET

(57) ABSTRACT

The present invention provides a red light emitting glass ceramic and a preparation method thereof, and an LED/LD light emitting device. $A_2Al_4Si_5O_{18}$:$Eu^{2+}$ cordierite of the red light emitting glass ceramic capable of realizing blue light excited red light emission is a crystal phase material, wherein A is at least one of Mg, Ca, Sr, Ba and Zn and at least comprises Mg. The present invention particularly provides the red light emitting glass ceramic taking a chemical formula $A_2Al_4Si_5O_{18}$:$Eu^{2+}$ as a crystal phase. The present invention further provides a preparation method of the transparent glass ceramic. The glass ceramic comprising the crystal phase, with the chemical formula of $Mg_2Al_4Si_5O_{18}$:$Eu^{2+}$, is excited by blue light to emit red light, the internal/
(Continued)

external quantum efficiencies reaching up to 94.5%/70.6%, respectively.

8 Claims, 2 Drawing Sheets

(51) Int. Cl.
 *C03B 32/02* (2006.01)
 *C03C 10/00* (2006.01)
 *C09K 11/77* (2006.01)
 *H10H 20/01* (2025.01)
 *H10H 20/851* (2025.01)

(52) U.S. Cl.
 CPC .... *C03C 10/0045* (2013.01); *C09K 11/77344* (2021.01); *H10H 20/8512* (2025.01); *H10H 20/0361* (2025.01)

(56) References Cited

FOREIGN PATENT DOCUMENTS

| CN | 110117160 | 8/2019 |
| CN | 112194376 | 1/2021 |
| JP | 2005206393 | 8/2005 |
| JP | 2007039303 | 2/2007 |

OTHER PUBLICATIONS

Feng, Xiong, "The Study on the preparation process and optical properties of Eu3+: CaF2 transparent fluorescent ceramic, " Thesis of Master Degree, Wuhan University of Technology, May 2018, pp. 1-78.

Dagmara Stefańska and Przemystaw J. Dereń, High Efficiency Emission of Eu2+ Located in Channel and Mg-Site of Mg2Al4Si5O18 Cordierite and Its Potential as a Bi-Functional Phosphor toward Optical Thermometer and White LED Application, Advanced Optical Materials, vol. 8, Issue 22, Nov. 18, 2020, pp. 1-10.

Yujie Zhang, et al., "A high quantum efficiency CaAlSiN3:Eu2+ phosphor-in-glass with excellent optical performance for white light-emitting diodes and blue laser diodes," Chemical Engineering Journal, vol. 401, Dec. 2020, pp. 1-35.

R. Wang, et al., "Red-emitting improvement of CaAlSiN3:Eu2+ phosphor-in-glass: Insight into the effect of atmospheric pressure preparation on photoluminescence properties and thermal degradation," Journal of Luminescence, vol. 225, Sep. 2020, pp. 1-10.

Shuxing Li, et al., "CaAlSiN3:Eu2+ translucent ceramic: a promising robust and efficient red color converter for solid state laser displays and lighting," Journal of Materials Chemistry C, Issue 35, Jan. 2016, pp. 1-28.

"International Search Report (Form PCT/ISA/210) of PCT/CN2021/077874," mailed on Jun. 30, 2021, with English translation thereof, pp. 1-6.

* cited by examiner

RED LIGHT EMITTING GLASS CERAMIC AND PREPARATION METHOD THEREOF, AND LED/LD LIGHT EMITTING DEVICE

CROSS-REFERENCE TO RELATED APPLICATION

This application is a continuation of international application of PCT application serial no. PCT/CN2021/077874 filed on Feb. 25, 2021, which claims the priority benefit of China application no. 202011046618.3, filed on Sep. 29, 2020. The entirety of each of the above mentioned patent applications is hereby incorporated by reference herein and made a part of this specification.

BACKGROUND

Technical Field

The present invention relates to the field of solid light emitting materials, particularly to a red light emitting glass ceramic and a preparation method thereof, and an LED/LD light emitting device.

Description of Related Art

A luminescent material converted white light LED features energy conservation, environmental friendliness, long service life and the like, and is regarded as the fourth generation white light source and is applied to the field of illumination and display. However, with increase of an input current density, an LED chip faces with a problem of heat irrelevant "efficiency drop", which is not conducive to applications of the LED chip in high brightness and high power white light illumination and display.

There is no "efficiency drop" phenomenon for a laser diode (LD) under input of a high current density, and the LD can output high luminous density beams with small beam diffusion angles, is more promising in high power application and can be used as a preferred scheme to implement high brightness white light. The laser white light is implemented by using a blue light laser excited fluorescence conversion material. A traditional way of packaging a fluorescent powder with an organic silica gel is not suitable for laser illumination, which is because that it will be subjected to aging in a high power using process due to poor physical and chemical stability performance of the silica gel. For this reason, all-inorganic fluorescent single crystals, ceramics and glass ceramics have attracted people's attention. However, there are only yellow and green light emitting fluorescent glass ceramics/ceramics/single crystals of garnet systems, which can meet the application requirements indeed.

As everyone knows, the white light source obtained by the glass ceramic/ceramic that couples blue light LED/LD with yellow and green light emission is higher in color temperature and low in color rendering index, so that its application is hindered. A red light emitting material is an indispensable part to acquire warm white light with low color temperature and high color rendering index. At present, the commercial red light emitting material for LED in the market is a $CaAlSiN_3:Eu^{2+}$ nitride red fluorescent powder with high light emitting quantum efficiency and good light emitting thermal stability performance. In order to research whether it is can be applied to a high power LD apparatus, researches have adopted the following methods: (1) mixing the $CaAlSiN_3:Eu^{2+}$ nitride red fluorescent powder with a low melting point glass powder, and melting the glass powder at a certain temperature to prepare a $CaAlSiN_3:Eu^{2+}$ glass ceramic (literature: doi.org/10.1016/j.cej.2020.125983 and doi.10.1016/j.jlumin.2020.117390); and (2) performing SPS sintering on the $CaAlSiN_3:Eu^{2+}$ nitride red fluorescent powder to obtain a ceramic. In order to densify the ceramic, $Si_3N_4$ and $SiO_2$ are introduced as sintering aids (literature: doi.org/10.1039/C6TC02518H). Compared with a $CaAlSiN_3:Eu^{2+}$ powder, the light emitting performance of the $CaAlSiN_3:Eu^{2+}$ glass ceramic/ceramic prepared by using the two preparation methods is decreased to a certain extent, which is because that a glass melt and the sintering aids have eroded $CaAlSiN_3:Eu^{2+}$. It is considered in the industry that the nitride fluorescent powder is not suitable for preparing the glass ceramic. Apparently, it is of great significance to prepare the all-inorganic red light emitting glass ceramic with high light emitting quantum efficiency and good thermoluminescent thermal stability performance, relevant researches are expected to promote rapid development high power white light sources, but it is a pity that there has been no high quality red light emitting glass ceramics/ceramics capable of meeting the actual applications.

SUMMARY

The present invention relates to a red light emitting glass ceramic taking cordierite as a crystal phase, particularly a red light emitting glass ceramic taking cordierite with a chemical formula $Mg_2Al_4Si_5O_{18}:Eu^{2+}$ as a crystal phase and a preparation technique thereof. The present invention is intended to develop a red fluorescence conversion material with high light emitting brightness and good light emitting thermal stability performance.

The present invention further provides a preparation method of the red light emitting glass ceramic, including: preparing precursor glass by reasonably designing precursor glass components and adopting a melt cooling technique; and then performing crystallized thermal treatment to prepare a cordierite micro/nano crystal inlaid red light emitting transparent glass ceramic. The red light emitting characteristic of the material can be optimized by adjusting the glass components and optimizing the thermal treatment process, and red light emission is originated from emission of divalent europium ions in cordierite crystal phases. The material in the present invention can be excited by light in a waveband of 300-500 nanometers to emit broadband red light with a peak wavelength located in 600-650 nanometers. The material in the present invention features quite excellent light emitting stability performance and can bear thermal effects caused by high density laser irradiation and laser.

The red light emitting glass ceramic provided by the present invention includes a cordierite crystal phase with a chemical formula of $A_2Al_4Si_5O_{18}:Eu^{2+}$, wherein A is at least one of Mg, Ca, Sr, Ba and Zn and at least includes Mg. It has a crystal structure identical to that of $Mg_2Al_4Si_5O_{18}$.

A preparation method of an efficient red light emitting glass ceramic includes the following steps:

step (1) designing chemical components of a precursor glass matrix, the glass matrix includes the following components:

10-80 mol % of $SiO_2$, 5-70 mol % of $Al_2O_3$, 5-70 mol % of MgO, 0-60 mol % of CaO, 0-60 mol % of SrO, 0-60 mol % of BaO, 0-60 mol % of ZnO and 0.01-10 mol % of $Eu_2O_3$, totaling 100 mol %; the glass matrix at least includes four raw materials: $SiO_2$, $Al_2O_3$, MgO and $Eu_2O_3$;

further, the glass matrix preferably includes the following components:

SiO$_2$ is preferably 15-75 mol %, more preferably 30-70 mol %;

Al$_2$O$_3$ is preferably 10-40 mol %, more preferably 15-35 mol %;

MgO is preferably 10-40 mol %, more preferably 15-35 mol %;

CaO is preferably 0-25 mol %, more preferably 0-20 mol %;

SrO is preferably 0-25 mol %, more preferably 0-20 mol %;

BaO is preferably 0-25 mol %, more preferably 0-20 mol %;

ZnO is preferably 0-25 mol %, more preferably 0-20 mol %;

Eu$_2$O$_3$ is preferably 0.05-8 mol %, more preferably 0.1-7 mol %;

step (2) weighing powders such as SiO$_2$, Al$_2$O$_3$, MgO, CaO, SrO, BaO, ZnO and Eu$_2$O$_3$ according to a certain component proportion, placing the powders in a crucible after evenly grinding powders in an agate mortar, heating the powders to a certain temperature in a reducing atmosphere and subjecting the powders to heat preservation for a period of time to melt the powders; and then, cooling the melted liquid to obtain bulk transparent precursor glass; and step (3) heating the obtained precursor glass to a certain temperature in the reducing atmosphere, and subjecting the precursor glass to heat preservation to crystallize the precursor glass to obtain a red light emitting glass ceramic with the cordierite crystal phase.

Further, in step (2), the raw materials MgO, CaO, SrO, BaO and ZnO in the glass components can be replaceable by carbonates MgCO$_3$, CaCO$_3$, SrCO$_3$, BaCO$_3$ and ZnCO$_3$ corresponding to MgO, CaO, SrO, BaO and ZnO. Eu$_2$O$_3$ can further be replaceable by europium-containing raw materials such as EuF$_3$, EuCl$_3$ and EuBr$_2$.

Further, the reducing atmosphere in step (2) is a reducing atmosphere such as a nitrogen and hydrogen mixed gas, an argon and hydrogen mixed gas, a reduced C powder or CO. The reducing atmosphere is preferably nitrogen and hydrogen mixed gas.

Further, in step (2), a heating temperature is 1450-1700° C., preferably 1500-1600° C. Heat preservation is performed for 30 min to 8 h, preferably 2-4 h, so that the powders are fully melted.

Further, in step (2), the glass melt can be taken away from a high temperature and can be quickly poured into a mold to be formed to obtain bulk precursor glass, and the glass melt can further be subjected to furnace cooling to obtain the block precursor glass.

Further, the reducing atmosphere in step (3) is a reducing atmosphere such as a nitrogen and hydrogen mixed gas, an argon and hydrogen mixed gas, a reduced C powder or CO. The reducing atmosphere is preferably nitrogen and hydrogen mixed gas.

Further, in step (3), in the temperature rise process, a temperature rise rate is controlled at 1-10° C./min, preferably, 2-5° C./min.

Further, in step (3), the precursor glass is heated to 700-1250° C., preferably 850-1150° C. in a tubular furnace. Heat preservation is performed for 5 min to 12 h, preferably 10 min to 8 h, so that the precursor glass is crystallized to obtain the transparent glass ceramic.

According to the present invention, the preparation method specifically includes the following steps:

step (1) weighing powder raw materials such as SiO$_2$, Al$_2$O$_3$, MgO, CaO, SrO, BaO, ZnO and Eu$_2$O$_3$ according to a certain component proportion, placing the powder raw materials in an alumina crucible after evenly grinding the powder raw materials in an agate ball-milling pot, putting the powder raw materials in a tubular furnace, filling the tubular furnace with a nitrogen and hydrogen mixed gas, heating the powder raw materials to 1500-1600° C., and subjecting the powder raw materials to heat preservation for 2-4 h to melt the powder raw materials; and then taking the glass melt out and quickly pouring the glass melt into a mold to be formed to obtain bulk precursor glass, or subjecting the glass melt to furnace cooling to obtain the bulk precursor glass; and step (2) placing the obtained precursor glass in the furnace again in the nitrogen and hydrogen reducing atmosphere to be heated at a temperature rise rate of 2-5° C./min to 850-1150° C., subjecting the precursor glass to heat preservation for 10 min to 8 h to crystallize the precursor glass so as to obtain a block glass ceramic.

In the present invention, the red light emitting cordierite glass ceramic can be obtained by using the above material components and preparation process, particularly, the cordierite glass ceramic with the chemical formula of Mg$_2$Al$_4$Si$_5$O$_{18}$:Eu$^{2+}$. Excited by 450 nanometers blue light, the material emits bright red light and is excellent in thermal quenching resistance.

A red light emitting conversion type LED/LD light emitting device includes a package substrate, a blue light LED chip/a blue light LD diode and a fluorescent material capable of absorbing LED/LD blue light emission effectively and releasing red light, wherein the red light releasing fluorescent material is the red light emitting glass ceramic containing the cordierite crystal phase;

A white light emitting conversion type LED/LD light emitting device includes a package substrate, a blue light LED chip/a blue light LD diode and a fluorescent material capable of absorbing LED/LD blue light emission effectively and releasing yellow light or green light and a fluorescent material capable of releasing red light, wherein the red light releasing fluorescent material is the red light emitting glass ceramic containing the cordierite crystal phase.

The present invention further relates to an application of a glass ceramic, and the glass ceramic can be applied to conversion type LED/LD light emitting devices as a red fluorescence conversion material.

In the present invention, the red light emitting glass ceramic coupled with an about 445 nanometer blue light LED chip or LD laser diode can obtain bright red light emission. The apparatus features excellent performance, and through optimization, the luminous flux and the luminous efficiency of the apparatus can further be improved.

Compared with the prior art, the present invention has the technical effects.

An existing technique to prepare an all-inorganic red fluorescent glass ceramic includes: mixing a commercial red fluorescent powder with a low melting point glass powder, and jointly sintering the commercial red fluorescent powder and the low melting point glass powder to obtain the all-inorganic red fluorescent glass ceramic. After the glass powder is melted at a high temperature, it will be reacted with a CaAlSiN$_3$:Eu$^{2+}$ fluorescent powder, which will lead to decrease of light emitting performance. There are related researches on the all-inorganic red fluorescent glass ceramic. For example, Teacher XIE Rongjun, Xiamen University, has prepared a CaAlSiN$_3$:Eu$^{2+}$ fluorescent ceramic by using an SPS sintering technique. With respect to performance of a red light LD apparatus constructed based on the ceramic, performance output of maximum luminous flux of 203 lm and maximum luminous efficiency of 42 lm/W is realized. It is the best performance reported so far.

At present, there is no way of preparing the red fluorescent glass ceramic by means of glass crystallization. The present invention has prepared the glass ceramic taking the crystal phase as Mg$_2$Al$_4$Si$_5$O$_{18}$:Eu$^{2+}$ by using the technique. The glass ceramic is excited by blue light to emit red light, the internal/external quantum efficiencies reaching up to 94.5%/70.6%, respectively. It features excellent light emitting thermal stability performance and has potential practical value. The luminous flux and the luminous efficiency of the red light emitting apparatus that couples the glass ceramic in the present invention with blue light laser are about 274 lm and about 54 lm/W, respectively. The red light emitting apparatus in the present invention is superior to a red light LD apparatus constructed based on the CaAlSiN$_3$:Eu$^{2+}$ fluorescent ceramic. The glass ceramic in the present invention can be applied to conversion type LED/LD light emitting devices.

DESCRIPTION OF THE EMBODIMENTS

Further description of specific embodiments of the present invention in detail will be made below in combination with examples and drawings, but the implementation modes and protection scope of the present invention are not limited thereto.

Example 1

Analytically pure SiO$_2$, Al$_2$O$_3$, MgO and Eu$_2$O$_3$ powders were precisely weighed according to a proportion (molar ratio) of 40SiO$_2$: 35Al$_2$O$_3$: 24MgO: 1Eu$_2$O$_3$ and were placed in an agate ball-milling pot, the powders were placed in an alumina crucible after the powders were evenly ground in the agate ball-milling pot, the powders were put in a tubular furnace where a nitrogen and hydrogen mixed gas was introduced, the powders were heated to 1450° C., and the powders were subjected to heat preservation for 1 h to melt the powders; then, a melt was subjected to furnace cooling to obtain precursor glass; and the bulk glass was heated to 1100° C. still in the nitrogen and hydrogen mixed atmosphere, and was subjected to heat preservation for 20 min to crystallize the bulk glass so as to obtain the red light emitting glass ceramic sample.

Figure 1:
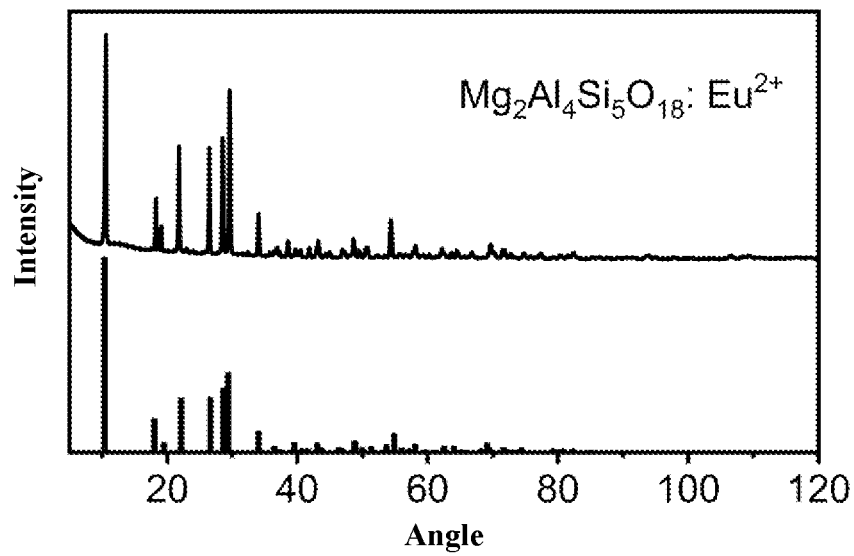
FIG. 1 is an X-ray diffraction pattern of a red light emitting glass ceramic sample in an example 1.
Figure 2:
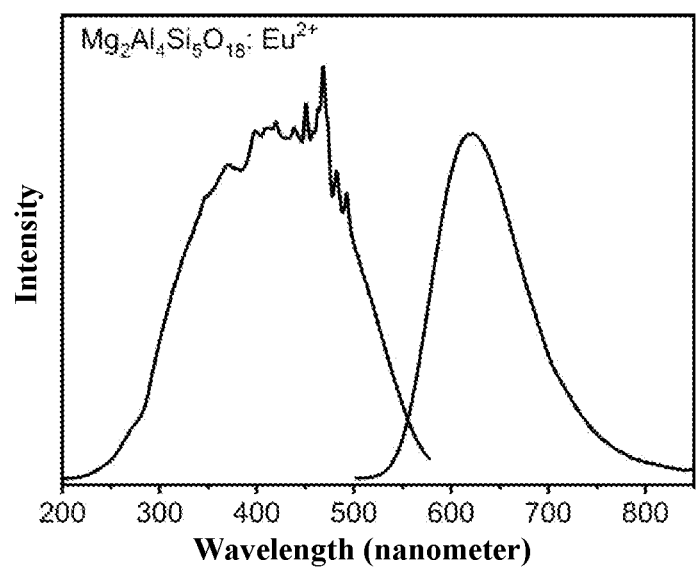
FIG. 2 is excitation and emission spectra of a red light emitting glass ceramic sample in an example 1.
Figure 3:
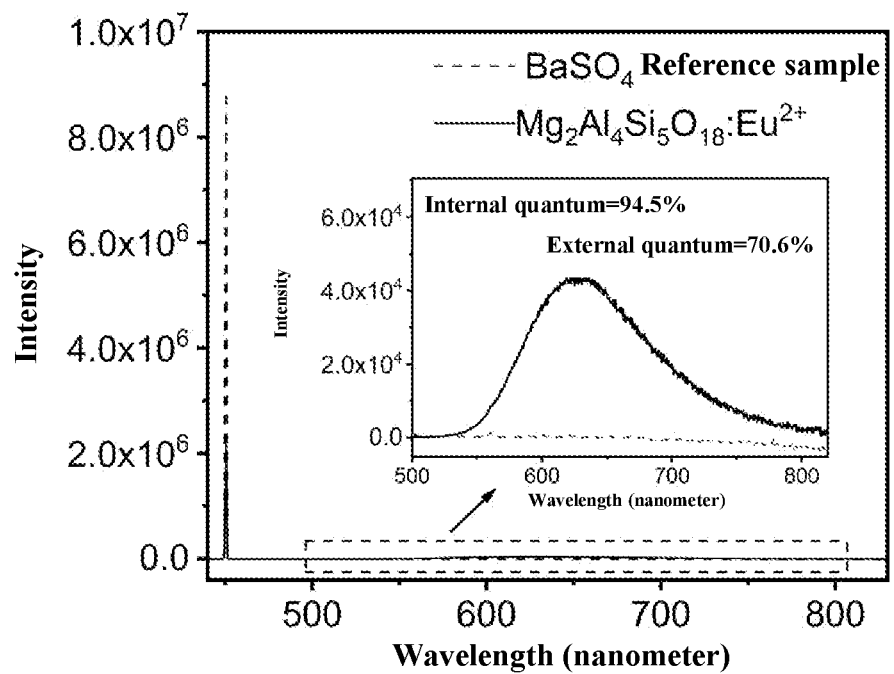
FIG. 3 is a tested quantum efficiency spectrum of a red light emitting glass ceramic sample in an example 1.
Figure 4:
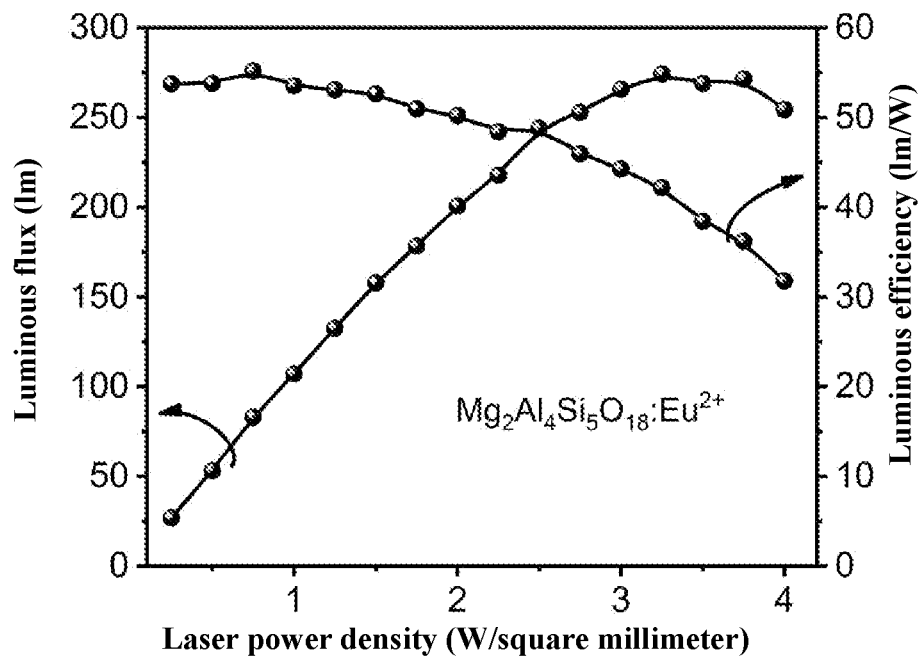
FIG. 4 is a luminous flux and luminous efficiency diagram dependent on a laser power density of a red light emitting glass ceramic sample in an example 1.

X-ray diffraction data indicates that an Mg$_2$Al$_4$Si$_5$O$_{18}$:Eu$^{2+}$ micro crystal glass ceramic is prepared (as shown in FIG. 1). FIG. 2 is excitation and emission spectra of a sample at room temperature. The glass ceramic can be excited by near ultraviolet and blue light to emit light with a wavelength range of 500-850 nm. The emitting color is red, corresponding to energy level transition of Eu$^{2+}$: 5d$_1$→4f. The light emitting internal/external quantum efficiencies are respectively 94.5%/70.6% (FIG. 3). The performance of the apparatus is tested by coupling the red light emitting sample with blue light laser, and the maximum luminous flux and the maximum luminous efficiency are respectively about 274 lm and about 54 lm/W (FIG. 4).

Example 2

Analytically pure SiO$_2$, Al$_2$O$_3$, MgO, CaO and Eu$_2$O$_3$ powders were precisely weighed according to a proportion (molar ratio) of 40SiO$_2$: 30Al$_2$O$_3$: 20MgO: 9CaO: 1Eu$_2$O$_3$ and were placed in an agate ball-milling pot, the powders were placed in an alumina crucible after the powders were evenly ground in the agate ball-milling pot, the powders were put in a tubular furnace where a nitrogen and hydrogen mixed gas was introduced, the powders were heated to 1700° C., and the powders were subjected to heat preservation for 8 h to melt the powders; then, a melt was subjected to furnace cooling to obtain precursor glass; and the bulk glass was heated to 700° C. still in the nitrogen and hydrogen mixed atmosphere, and was subjected to heat preservation for 12 h to crystallize the bulk glass so as to obtain the red light emitting glass ceramic sample.

After the test, the Mg$_{1.5}$Ca$_{0.5}$Al$_4$Si$_5$O$_{18}$:Eu$^{2+}$ nano crystal glass ceramic is prepared, the light emitting internal/external quantum efficiencies being respectively 90%/70%. The performance of the apparatus is tested by coupling the red light emitting sample with blue light laser, and the maximum luminous flux and the maximum luminous efficiency are respectively about 250 lm and about 52 lm/W.

Example 3

Analytically pure SiO$_2$, Al$_2$O$_3$, MgO, BaO and Eu$_2$O$_3$ powders were precisely weighed according to a proportion (molar ratio) of 40SiO$_2$: 30Al$_2$O$_3$: 20MgO: 9BaO: 1Eu$_2$O$_3$ and were placed in an agate ball-milling pot, the powders were placed in an alumina crucible after the powders were evenly ground in the agate ball-milling pot, the powders were put in a tubular furnace where a nitrogen and hydrogen mixed gas was introduced, the powders were heated to 1700° C., and the powders were subjected to heat preservation for 30 min to melt the powders; then, a melt was subjected to furnace cooling to obtain precursor glass; and the bulk glass was heated to 1000° C. still in the nitrogen and hydrogen mixed atmosphere, and was subjected to heat preservation for 4 h to crystallize the bulk glass so as to obtain the red light emitting glass ceramic sample.

After the test, the Mg$_{1.5}$Ba$_{0.5}$Al$_4$Si$_5$O$_{18}$:Eu$^{2+}$ nano crystal glass ceramic is prepared, the light emitting internal/external quantum efficiencies being respectively 96%/75%. The performance of the apparatus is tested by coupling the red light emitting sample with blue light laser, and the maximum luminous flux and the maximum luminous efficiency are respectively about 260 lm and about 45 lm/W.

Example 4

Analytically pure SiO$_2$, Al$_2$O$_3$, MgO, SrO and Eu$_2$O$_3$ powders were precisely weighed according to a proportion (molar ratio) of 40SiO$_2$: 30Al$_2$O$_3$: 20MgO: 9SrO: 1Eu$_2$O$_3$ and were placed in an agate ball-milling pot, the powders were placed in an alumina crucible after the powders were evenly ground in the agate ball-milling pot, the powders were put in a tubular furnace where a nitrogen and hydrogen mixed gas was introduced, the powders were heated to 1550° C., and the powders were subjected to heat preservation for 6 h to melt the powders; then, a melt was subjected to furnace cooling to obtain precursor glass; and the bulk glass was heated to 900° C. still in the nitrogen and hydrogen mixed atmosphere, and was subjected to heat preservation for 10 h to crystallize the block glass so as to obtain the red light emitting glass ceramic sample.

After the test, the $Mg_{1.6}Sr_{0.4}Al_4Si_5O_{18}:Eu^{2+}$ nano crystal glass ceramic is prepared, the light emitting internal/external quantum efficiencies being respectively 92%/65%. The performance of the apparatus is tested by coupling the red light emitting sample with blue light laser, and the maximum luminous flux and the maximum luminous efficiency are respectively about 250 lm and about 55 lm/W.

Example 5

Analytically pure $SiO_2$, $Al_2O_3$, MgO, ZnO and $Eu_2O_3$ powders were precisely weighed according to a proportion (molar ratio) of $40SiO_2$: $30Al_2O_3$: 20MgO: 9ZnO: $1Eu_2O_3$ and were placed in an agate ball-milling pot, the powders were placed in an alumina crucible after the powders were evenly ground in the agate ball-milling pot, the powders were put in a tubular furnace where a nitrogen and hydrogen mixed gas was introduced, the powders were heated to 1500° C., and the powders were subjected to heat preservation for 5 h to melt the powders; then, a melt was subjected to furnace cooling to obtain precursor glass; and the bulk glass was heated to 1050° C. still in the nitrogen and hydrogen mixed atmosphere, and was subjected to heat preservation for 2 h to crystallize the block glass so as to obtain the red light emitting glass ceramic sample.

After the test, the $Mg_{1.6}Zn_{0.4}Al_4Si_5O_{18}:Eu^{2+}$ nano crystal glass ceramic is prepared, the light emitting internal/external quantum efficiencies being respectively 85%/65%. The performance of the apparatus is tested by coupling the red light emitting sample with blue light laser, and the maximum luminous flux and the maximum luminous efficiency are respectively about 220 lm and about 45 lm/W.

The above is merely preferred embodiments of the present invention and is not used to limit the present invention. For those skilled in the art, various alternations and changes can be made on the present invention. Any modification, equivalent replacement, improvement, etc. made within the spirit and principle of the present invention shall be regarded as within the protection scope of the present invention.

What is claimed is:

1. A red light emitting glass ceramic, comprising a cordierite crystal phase with a chemical formula of $A_2Al_4Si_5O_{18}:Eu^{2+}$, wherein A is at least one of Mg, Ca, Sr, Ba and Zn and at least comprises Mg.

2. The red light emitting glass ceramic according to claim 1, wherein a precursor for preparing the red light emitting glass ceramic is a glass matrix, and the glass matrix for preparing the red light emitting glass ceramic comprises the following components: 10-80 mol % of $SiO_2$, 5-70 mol % of $Al_2O_3$, 5-70 mol % of MgO, 0-60 mol % of CaO, 0-60 mol % of SrO, 0-60 mol % of BaO, 0-60 mol % of ZnO, 0.01-10 mol % of $Eu_2O_3$, totaling 100 mol %, and the glass matrix at least comprises four raw materials: $SiO_2$, $Al_2O_3$, MgO and $Eu_2O_3$.

3. A preparation method of the red light emitting glass ceramic according to claim 1, comprising the following steps:
   step (1) weighing the raw materials: $SiO_2$, $Al_2O_3$, MgO, CaO, SrO, BaO, ZnO and $Eu_2O_3$ in proportion of ingredient, heating the raw materials in a reducing atmosphere after the raw materials are subjected to mixing and even grinding, subjecting the raw materials to heat preservation to melt the raw materials to obtain melt liquid, and then cooling the melt liquid to obtain bulk transparent precursor glass; and
   step (2) heating the bulk transparent precursor glass obtained in step (1) in the reducing atmosphere, and subjecting the bulk transparent precursor glass to heat preservation to crystallize the bulk transparent precursor glass so as to obtain the red light emitting glass ceramic with the cordierite crystal phase.

4. The preparation method according to claim 3, wherein one or more of the raw materials MgO, CaO, SrO, BaO and ZnO is replaceable by carbonates $MgCO_3$, $CaCO_3$, $SrCO_3$, $BaCO_3$ and $ZnCO_3$ corresponding to MgO, CaO, SrO, BaO and ZnO.

5. The preparation method according to claim 3, wherein the reducing atmosphere in step (1) is a nitrogen and hydrogen mixed gas, an argon and hydrogen mixed gas, a reduced C powder or CO, with a heating temperature being 1450-1700° C. and a heat preservation time being 30 min to 8 h; and the reducing atmosphere in step (2) is a nitrogen and hydrogen mixed gas, an argon and hydrogen mixed gas, a reduced C powder or CO, with a heating temperature being 700-1250° C. and a heat preservation time being 5 min to 12 h.

6. The preparation method according to claim 4, wherein the reducing atmosphere in step (1) is a nitrogen and hydrogen mixed gas, an argon and hydrogen mixed gas, a reduced C powder or CO, with a heating temperature being 1450-1700° C. and a heat preservation time being 30 min to 8 h; and the reducing atmosphere in step (2) is a nitrogen and hydrogen mixed gas, an argon and hydrogen mixed gas, a reduced C powder or CO, with a heating temperature being 700-1250° C. and a heat preservation time being 5 min to 12 h.

7. A red light emitting LED/LD light emitting device, comprising a package substrate, a blue light LED chip/a blue light LD diode and a fluorescent material capable of absorbing LED/LD blue light emission and emitting red light, wherein the red light emitting fluorescent material is the red light emitting glass ceramic according to claim 1.

8. A white light emitting LED/LD light emitting device, comprising a package substrate, a blue light LED chip/a blue light LD diode and a fluorescent material capable of absorbing LED/LD blue light emission and releasing yellow light or green light and a fluorescent material capable of releasing red light, wherein the red light releasing fluorescent material is the red light emitting glass ceramic according to claim 1.

* * * * *